United States Patent
Lin et al.

(10) Patent No.: US 9,344,116 B2
(45) Date of Patent: May 17, 2016

(54) METHOD FOR DETERMINING LAYER STOPPAGE IN LDPC DECODING

(71) Applicant: YUAN ZE UNIVERSITY, Taoyuan County (TW)

(72) Inventors: Cheng-Hung Lin, Taoyuan County (TW); Tzu-Hsuan Huang, Taoyuan County (TW); Shin-An Chou, Taoyuan County (TW)

(73) Assignee: YUAN ZE UNIVERSITY, Taoyuan County (TW)

( * ) Notice: Subject to any disclaimer, the term of this patent is extended or adjusted under 35 U.S.C. 154(b) by 118 days.

(21) Appl. No.: 14/290,103

(22) Filed: May 29, 2014

(65) Prior Publication Data

US 2015/0349800 A1 Dec. 3, 2015

(51) Int. Cl.
*H03M 13/00* (2006.01)
*H03M 13/11* (2006.01)
*G06N 7/00* (2006.01)

(52) U.S. Cl.
CPC .......... *H03M 13/1111* (2013.01); *G06N 7/005* (2013.01); *H03M 13/611* (2013.01)

(58) Field of Classification Search
None
See application file for complete search history.

(56) References Cited

U.S. PATENT DOCUMENTS

| | | | | |
|---|---|---|---|---|
| 6,633,856 B2* | 10/2003 | Richardson | ............... | G06N 3/02 341/107 |
| 8,291,283 B1* | 10/2012 | Rad | ..................... | H03M 13/036 714/752 |
| 8,291,285 B1* | 10/2012 | Varnica | ............. | H03M 13/1137 714/752 |
| 2003/0014718 A1* | 1/2003 | De Souza | .......... | H03M 13/1102 714/804 |
| 2008/0273600 A1* | 11/2008 | Singh | ..................... | H04H 20/42 375/240.26 |
| 2009/0003379 A1* | 1/2009 | Shao | .................. | H04N 21/4122 370/466 |
| 2010/0146361 A1* | 6/2010 | Yuan | ................. | H03M 13/1105 714/752 |
| 2010/0211841 A1* | 8/2010 | Cao | ................... | H03M 13/1102 714/748 |
| 2011/0252294 A1* | 10/2011 | Ng | ...................... | H03M 13/114 714/804 |
| 2013/0061112 A1* | 3/2013 | Chen | .................. | H03M 13/114 714/758 |

OTHER PUBLICATIONS

C.-H. Lin, T.-H. Huang, C.-C. Chen and S.-Y. Lin,Efficient layer stopping technique for layered LDPC decoding,Electronics Letters,vol. 49,No. 16, pp. 994-996, Aug. 1, 2013.

* cited by examiner

*Primary Examiner* — M. Mujtaba K Chaudry
(74) *Attorney, Agent, or Firm* — Locke Lord LLP; Tim Tingkang Xia, Esq.

(57) ABSTRACT

A method for determining a layer stoppage in LDPC decoding is provided. The method may include determining the occurrence of the layer stoppage to detect and record a convergence of a layer arithmetic unit after the performance of a layer decoding operation using LDPC decoding, and in a subsequent iteration operation stopping an operation of the layer arithmetic unit that has converged and repeating determining the layer stoppage for the layer arithmetic unit that has not yet converged. An output of the non-convergent layer may be diverted to the next non-convergent layer while bypassing the convergent layer without interrupting the subsequent iteration operation while maintaining the overall error correction capability.

10 Claims, 9 Drawing Sheets

| | non-convergent layer | convergent layer |
|---|---|---|
| variable node computation | open | close |
| check node computation | open | close |
| a posteriori probability value computation | open | close |
| check node memory access | open | close |
| post probability value memory access | open | open |

*FIG.4* ized as a convergent layer so long as a layer associated with the convergent layer is entirely convergent and in the subsequent iteration operation no layer decoding operation using LDPC decoding is required for the convergent layer, and the layer arithmetic unit is characterized as a non-convergent layer when the layer associated with the non-convergent layer is not entirely convergent.

METHOD FOR DETERMINING LAYER STOPPAGE IN LDPC DECODING

BACKGROUND

1. Technical Field

The present disclosure relates to a method for determining a layer stoppage in low density parity check (LDPC) decoding. Specially, the present disclosure is directed to a method for determining convergence of a layer based on information over the course of LDPC decoding. The present disclosure may skip the convergent layer in the subsequent iteration operation for reducing the power consumption associated with a corresponding layer arithmetic unit.

2. Description of Related Art

In recent years, industry-wide booming in telecommunication accompanies with the increased demands in multimedia processing and high-speed wireless transmission. For meeting the above demands, low density parity check (LDPC) code that is superior in its decoding performance has been widely adopted in numerous wireless communication standards such as DVB-S2, IEEE 802.11n, and IEEE 802.16m. LDPC decoding operations turn to multiple iterations to enhance their error correction capability, pushing their coding gain to Shannon limit.

With the number of the iterations increasing, power consumption of LDPC decoders inevitably increases significantly. Approaches of cutting down the iterations by determining redundancy of certain iterations become effective in reducing the power consumption. They aim to suspend the decoding that has converged without sacrificing the performance of entire LDPC decoding. However, those approaches would not stop the whole iteration operation until after the entire information has converged without concerning if any of individual layers may have converged. That the decoding operation would have been suspended until the entire information is considered "converged" may still result in unnecessary power consumption.

To overcome the above problem, a method for determining a layer stoppage (LS) has been proposed. Such layer stoppage may be determined or detected based on convergence of the layer after a layer decoding operation for the layer concludes. If that is the case, such layer may be considered "convergent." In subsequent iteration operation, the layer decoding operation may not be performed for the "convergent" layer, so as to reduce the unnecessary power consumption.

SUMMARY OF THE DISCLOSURE

The present disclosure revolves around a method for determining a layer stoppage in LDPC decoding. When a layer is considered convergent, such layer may not be subject to another layer decoding operation so as to achieve the goal of power consumption reduction.

The method may include determining the occurrence of a layer stoppage to detect and record a convergence of a layer arithmetic unit after the performance of a layer decoding operation using LDPC decoding, and in a subsequent iteration operation stopping an operation of the layer arithmetic unit that has converged and repeating determining the layer stoppage for the layer arithmetic unit that has not yet converged.

Specifically, the occurrence of the layer stoppage is based on the comparison using soft information or hard information of the layer decoding operation for determining the convergence of the layer arithmetic unit.

Specifically, the layer arithmetic unit is characterized as a convergent layer so long as a layer associated with the convergent layer is entirely convergent and in the subsequent iteration operation no layer decoding operation using LDPC decoding is required for the convergent layer, and the layer arithmetic unit is characterized as a non-convergent layer when the layer associated with the non-convergent layer is not entirely convergent.

Specifically, in the subsequent iteration operation an output of the non-convergent layer is diverted to the next non-convergent layer without being transmitted to the convergent layer in between.

Specifically, in the subsequent iteration operation soft information or hard information in the determination of the occurrence of the layer stoppage is diverted to the next non-convergent layer from the previous convergent layer without being transmitted to the convergent layer in between.

Specifically, the soft information comprises a check node message, a variable node message, an a priori probability value, an extrinsic probability value, an a posteriori probability value, and their combinations.

Specifically, the hard information comprises a hard information value converted from the check node message, the variable node message, the a priori probability value, the extrinsic probability value, the a posteriori probability value, and their combinations.

Specifically, the layer operations in multiple parallel layers are detected and stopped at the same time.

For further understanding of the present disclosure, reference is made to the following detailed description illustrating the embodiments and examples of the present disclosure. The description is only for illustrating the present disclosure, not for limiting the scope of the claim.

BRIEF DESCRIPTION OF THE DRAWINGS

The drawings included herein provide further understanding of the present disclosure. A brief introduction of the drawings is as follows:

FIG. 4 shows a table illustrative of the difference between a convergent layer and a non-convergent layer according to one embodiment of the present disclosure;

DESCRIPTION OF THE EXEMPLARY EMBODIMENTS

The aforementioned and other technical contents, features, and efficacies will be shown in the following detail descriptions of a preferred embodiment corresponding with the reference Figures.

Figure 1:
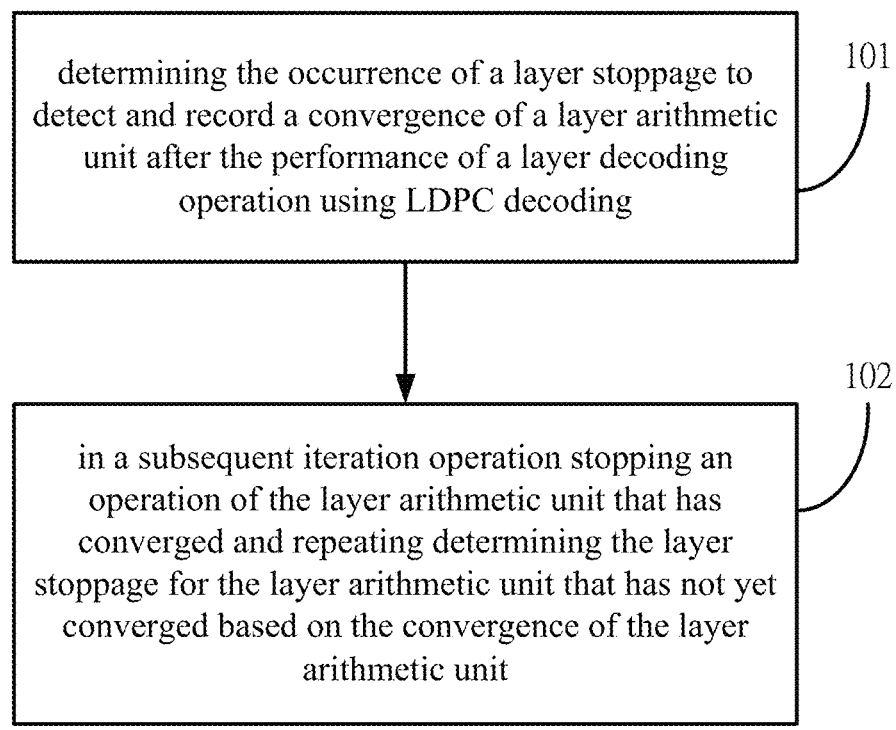
FIG. 1 shows a flow of a method for determining a layer stoppage in LDPC decoding according to one embodiment of the present disclosure.

The present disclosure is directed to a method for stopping a layer operation in low density parity check (LDPC) decoding. Such method, as shown in FIG. 1, may include (1) in step 101 determining the occurrence of a layer stoppage to detect and record a convergence of a layer arithmetic unit after the performance of a layer decoding operation using LDPC decoding, and (2) in a subsequent iteration operation stopping an operation of the layer arithmetic unit that has converged and repeating determining the layer stoppage for the layer arithmetic unit that has not yet converged based on the convergence of the layer arithmetic unit at step 102.

For determining the occurrence of the layer stoppage, step 101 may rely on soft or hard information associated with the layer decoding operation. When the layer corresponding to the layer arithmetic unit converges, such layer arithmetic unit may be characterized as one convergent layer. And in the subsequent iteration operation the layer decoding operation for such convergent layer may not be performed. On the other hand, when the layer corresponding to another layer arithmetic unit fails to converge, that particular layer arithmetic unit may be characterized as one non-convergent layer.

In the first embodiment, a LDPC decoding mechanism used for a traditional layer decoding in a non-volatile memory context is illustrated. Such LDPC decoding may employ a minimum-summation algorithm (Min-Sum Algorithm, MSA) in the layer operation. The method may include as previously mentioned determining the occurrence of the layer stoppage to detect and record the convergence of the layer arithmetic unit after the performance of the layer decoding operation using the MSA-based LDPC decoding, and in the subsequent iteration operation stopping an operation of the layer arithmetic unit that has converged and repeating determining the layer stoppage for the layer arithmetic unit that has not yet converged based on the convergence of the layer arithmetic unit.

For determining the occurrence of the layer stoppage, the method may rely on soft or hard information associated with the layer decoding operation. When the layer corresponding to the layer arithmetic unit converges, such layer arithmetic unit may be characterized as one convergent layer. And in the subsequent iteration operation the layer decoding operation for such convergent layer may not be performed. On the other hand, when the layer corresponding to another layer arithmetic unit fails to converge, that particular layer arithmetic unit may be characterized as one non-convergent layer.

Figure 2:
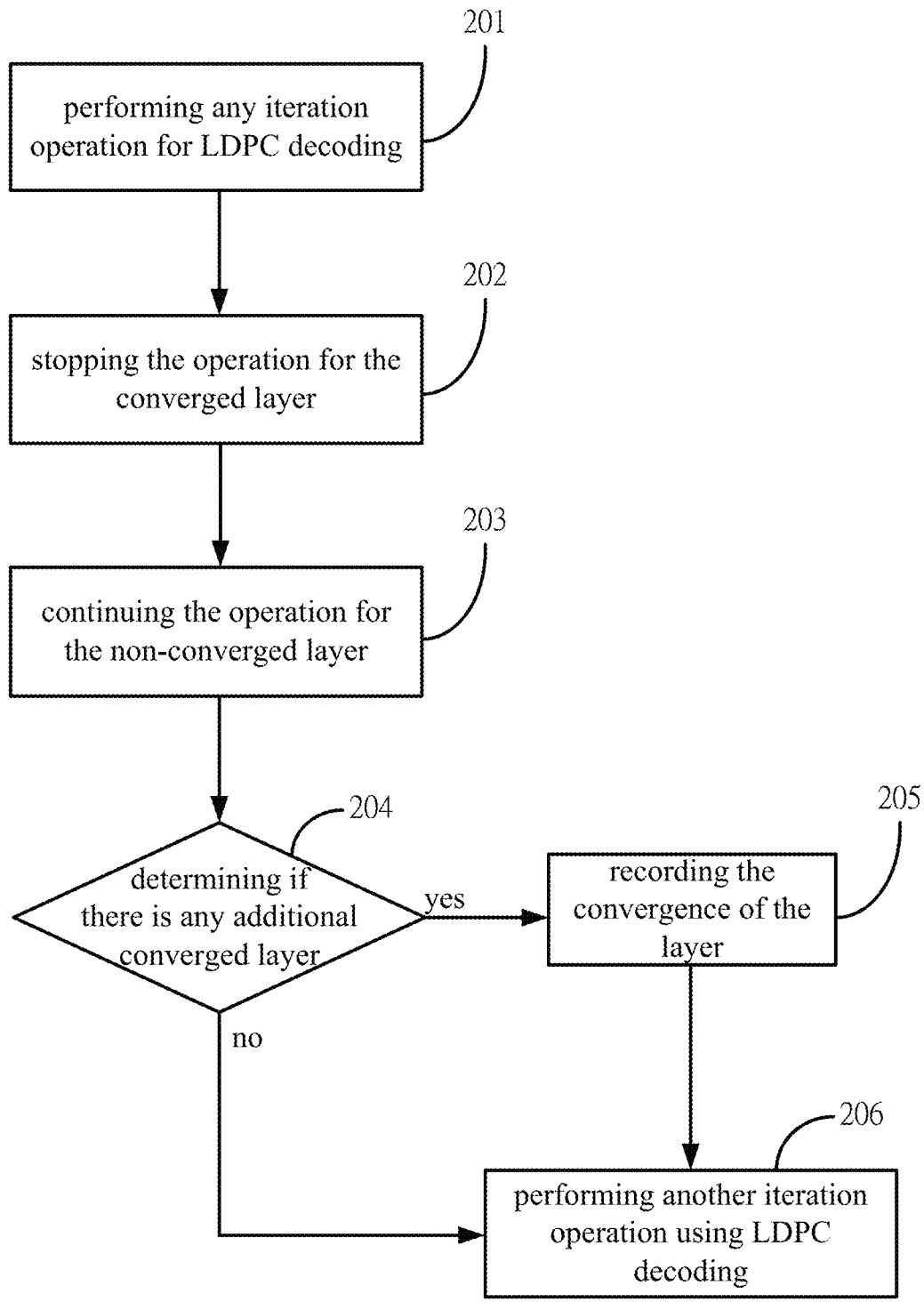
FIG. 2 shows a flow of LDPC decoding operation having the method in FIG. 1 incorporated according to one embodiment of the present disclosure.

In conjunction with FIG. 2, when in any iteration operation for LDPC decoding (step 201) the method in the first embodiment may stop the operation for the converged layer (step 202) before proceeding to the operation for the non-converged layer (step 203). Thereafter, the method may determine if there is any additional converged layer (step 204). If that is the case, the method may record the convergence of the layer (step 205). Otherwise, another iteration operation using LDPC decoding may be performed (step 206).

As shown in FIG. 2, because of the following iteration operations an output of one non-convergent layer may be outputted to the next non-convergent layer without being transmitted to any convergent layer between the above two non-convergent layers. Specifically, any operation for the convergent layer may be skipped when the soft information such as a check node message, a variable node message, an a priori probability value, an extrinsic probability value, an a posteriori probability value, and their combinations used in determining the layer stoppage or the hard information, which may be converted in terms of hard information value from the check node message, the variable node message, the a priori probability value, the extrinsic probability value, the a posteriori probability value, and their combinations.

Figure 3:
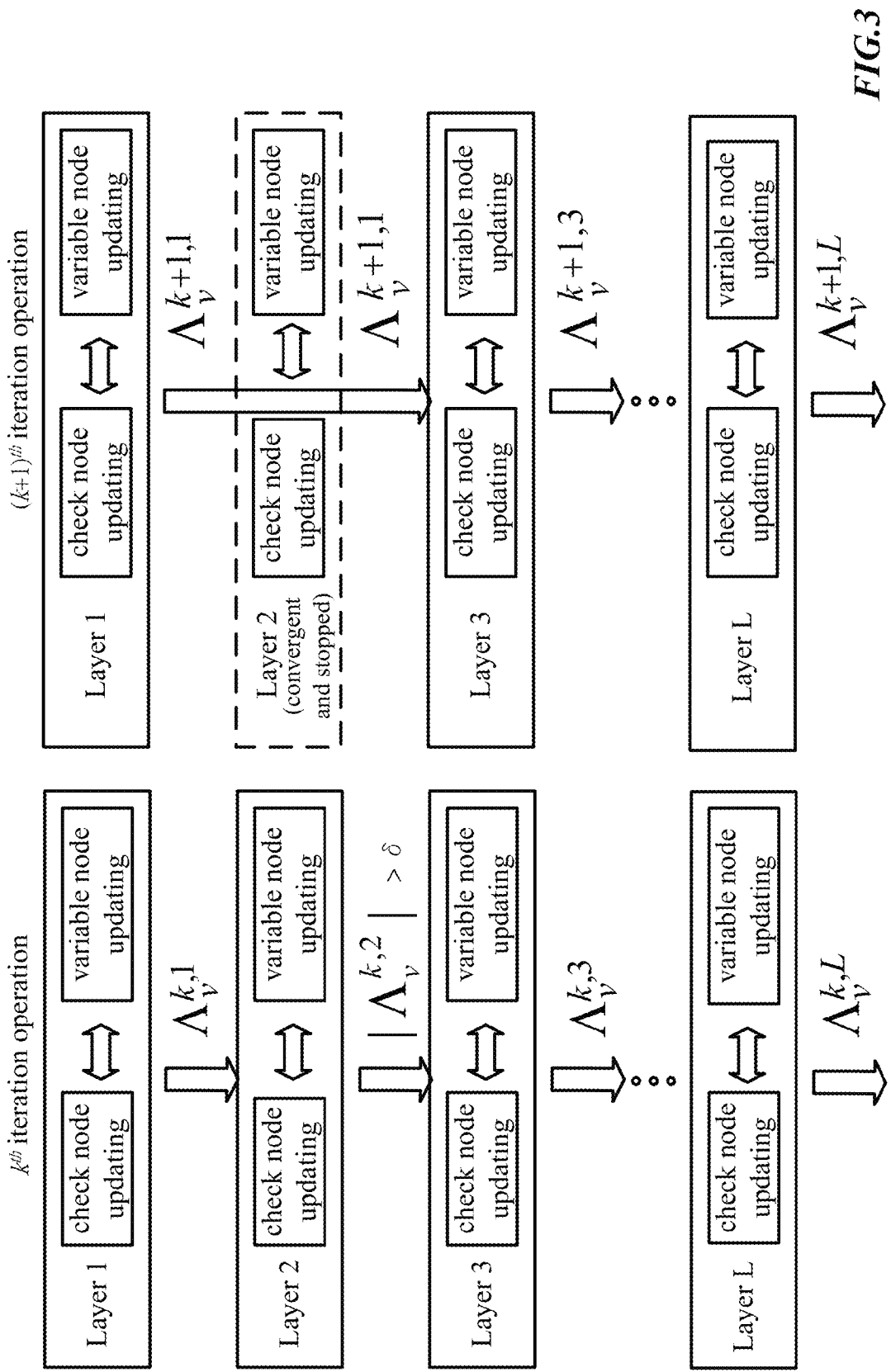
FIG. 3 shows a first embodiment of two consecutive iteration operations upon the determination of the convergence of a layer at the conclusion of layer decoding operation according to one embodiment of the present disclosure.

FIG. 3 illustrates two consecutive iteration operations having the layer stoppage technology into consideration. The left side of FIG. 3 shows one iteration operation where no layer stoppage occurs. The right side of FIG. 3, meanwhile, shows another iteration operation (or the iteration operation following the iteration operation on the left side) where certain layer stoppage has already occurred. The current embodiment may lean on the soft information in the layer decoding operation by comparing the soft information in order to record the convergence of the layer arithmetic operation unit. For the layer stoppage to be considered taking place, the a posteriori probability value ($\Lambda_v^{k,l}$) may serve as one threshold. For example, in the layer decoding operation using LDPC decoding the a posteriori probability value ($\Lambda_v^{k,l}$) associated with each layer operation may be detected and compared with its corresponding threshold. Specifically, when the a posteriori probability value ($\Lambda_v^{k,l}$) associated with Layer 2 (or the second layer arithmetic unit) is greater than the threshold ($\delta$), then Layer 2 may be characterized as the convergent layer while Layers 1 and 3 remain as non-convergent layer since their respective the a posteriori probability values ($\Lambda_v^{k,l}$) are not greater than the predetermined threshold.

Layer 2 or the second layer arithmetic unit may not be part of the subsequent iteration operation, reducing the usage of the layer arithmetic unit and the power consumption. The a posteriori probability value which is supposed to be delivered to the second layer arithmetic unit may now be diverted to the next non-convergent layer (or the third layer arithmetic unit). As shown in FIG. 3, the layer arithmetic unit may be responsible for check node updating and variable node updating along with the computation of the a posteriori probability value. FIG. 4 meanwhile summarizes operational difference between the convergent layer and the non-convergent layer. The check node, the variable node, the computation of the a posteriori probability value, and the access to the memory of the check node may be stopped, when the access to the memory of the a posteriori probability value may remain intact.

Figure 5:
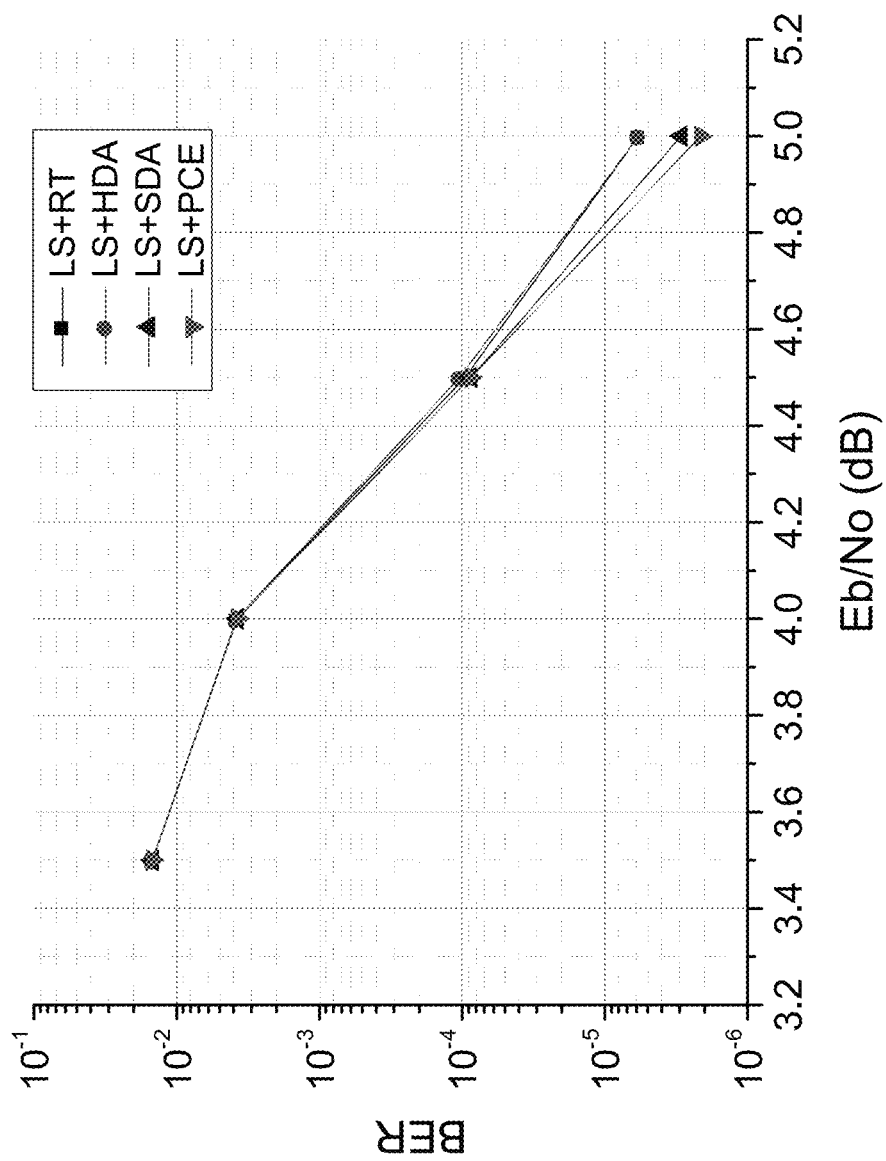
FIG. 5 is a schematic diagram illustrating a variance in layer decoding performance among the layer stoppage determination method with other approaches cutting down the number of iteration operations incorporated according to one embodiment of the present disclosure.

Since the decoding of the first embodiment could be LDPC decoding used in the non-volatile memory, in an additive Gaussian white noise channel with information length at 8960 bits and the maximum iterations at 15, as shown in FIG. 5, bit error rates (BER) of LDPC decoding at different SNR (Eb/N0) may vary when distinct combinations of technology are used. Specifically, the present disclosure directed to layer stoppage (LS) may have parity check equation (PCE), soft decision aided algorithm (SDA), hard decision aided algorithm (HDA) and rate termination (RT) integrated.

Figure 6:
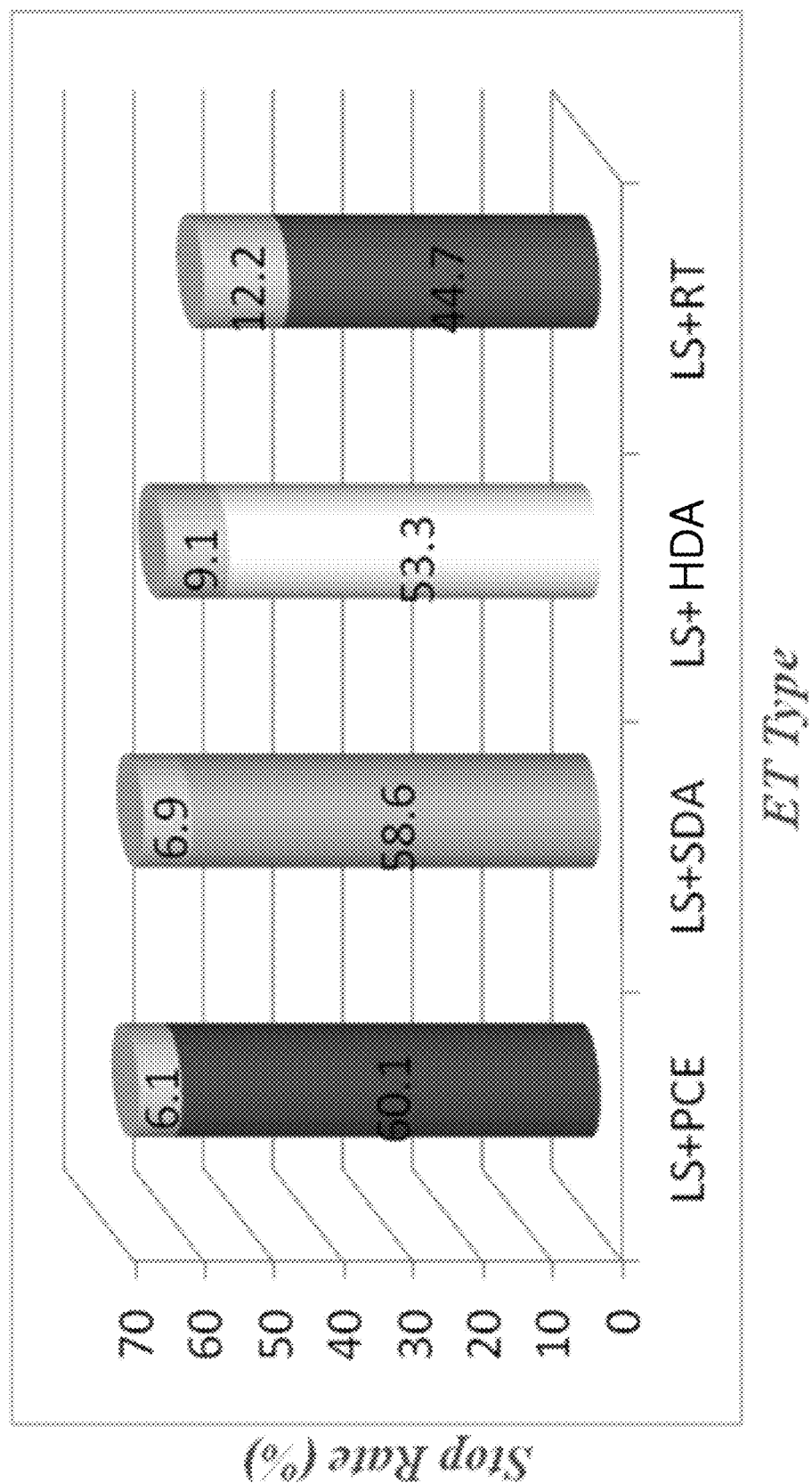
FIG. 6 is a schematic diagram illustrating a variance in stop rate among the layer stoppage determination method with other approaches cutting down the number of iteration operations incorporated according to one embodiment of the present disclosure.

Please combine together BER in FIG. 5 reflective of the error correction capability and a stop rate in FIG. 6 where variance in the stop rate associated with different combinations of approaches for cutting down the number of the iteration operations is shown. Specifically, upper numbers in columns indicate the stop rate corresponding to the layer stoppage technology, while the lower numbers in the columns are associated with the approaches of cutting down the iteration operation number without the incorporation of the layer stoppage technology. The number of the iteration operations may be reduced by 2%-48% at distinct SNR without interfering with the performance of LDPC decoding. Such reduction may climb to the range of 52%-70% once after the layer stoppage technology enters into the equation.

In short, the present disclosure could be combined with any of the conventional approaches of cutting down the iteration operations. The present disclosure may stop the operations for the convergent layers even before conditions for the traditional approaches of cutting down the iteration operations are met, increasing the stop rate.

When SDA is used for cutting down the number of the iteration operations, the a posteriori probability value after each iteration operation using LDPC decoding may be determined and compared with the corresponding threshold ($\phi$). The iteration operation may be stopped for the layer corresponding to the a posteriori probability value exceeding such threshold.

In another embodiment, when SDA is used a code word at the conclusion of each iteration operation by a LDPC decoder may be verified to determine if the corresponding condition is satisfied. The present disclosure may determine the convergence of the layers before such conditions are met, before skipping the iteration operation for the convergent layer.

In addition to the above-described first embodiment, the present disclosure further provides a second embodiment in the vehicle communication applications. The second embodiment, similarly, simulates the convergence of the layers (or the layer arithmetic units) using LDPC decoding. The second embodiment may operate with information 2048 bits in length, maximum iterations not exceeding 8, and parallel multi-core decoding that is different from the decoding algorithm in the first embodiment. The second embodiment may simulate using wireless channels such as Rayleigh channel in densely populated areas. By adopting the parallel multi-core processing, the second embodiment could significantly increase the throughput of the LDPC decoder at the expense of the larger power consumption, which could highlight the importance of skipping the operations of certain layers based on their convergence.

Figure 7:
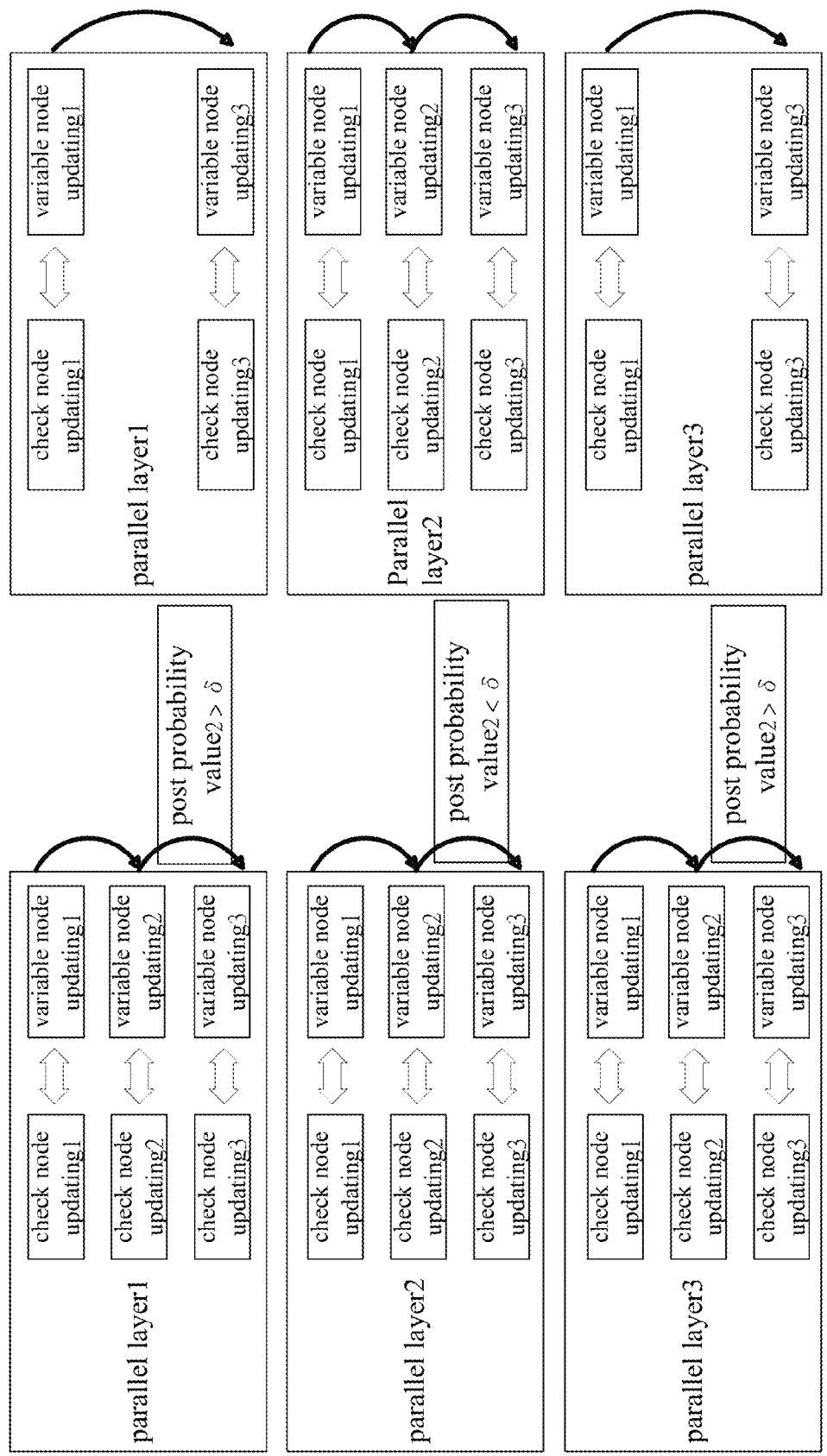
FIG. 7 shows another set of two consecutive iteration operations upon the determination of the convergence of a layer at the conclusion of layer decoding operation according to one embodiment of the present disclosure.

Specifically, as shown in FIG. 7, when the parallel multi-core processing is employed the decoding may operate at the higher rates despite performing the layer decoding operations for those convergent layers. With the present disclosure, the convergence of the multiple layers may be determined and their corresponding layer decoding operations may be skipped. In other words, the convergence of multiple parallel layers may be determined and some of their layer decoding operations may not be necessary.

The second embodiment illustrates detecting the a posteriori probability value of each parallel layer upon the conclusion of its corresponding parallel layer decoding operation using LDPC decoding. When the detected a posteriori probability value exceeds the predetermined threshold ($\delta$), the second embodiment may characterize such layer as the convergent layer and skipping such convergent layer in the subsequent iteration operation. In doing so, the present disclosure may reduce the usage of the layer arithmetic unit and therefore to reduce the overall power consumption. The a posteriori probability value that would be delivered to the convergent layer may be diverted to the next non-convergent bypassing the convergent layer. Multiple parallel layers and their layer arithmetic units may be skipped in the subsequent iteration process as the result.

Figure 8:
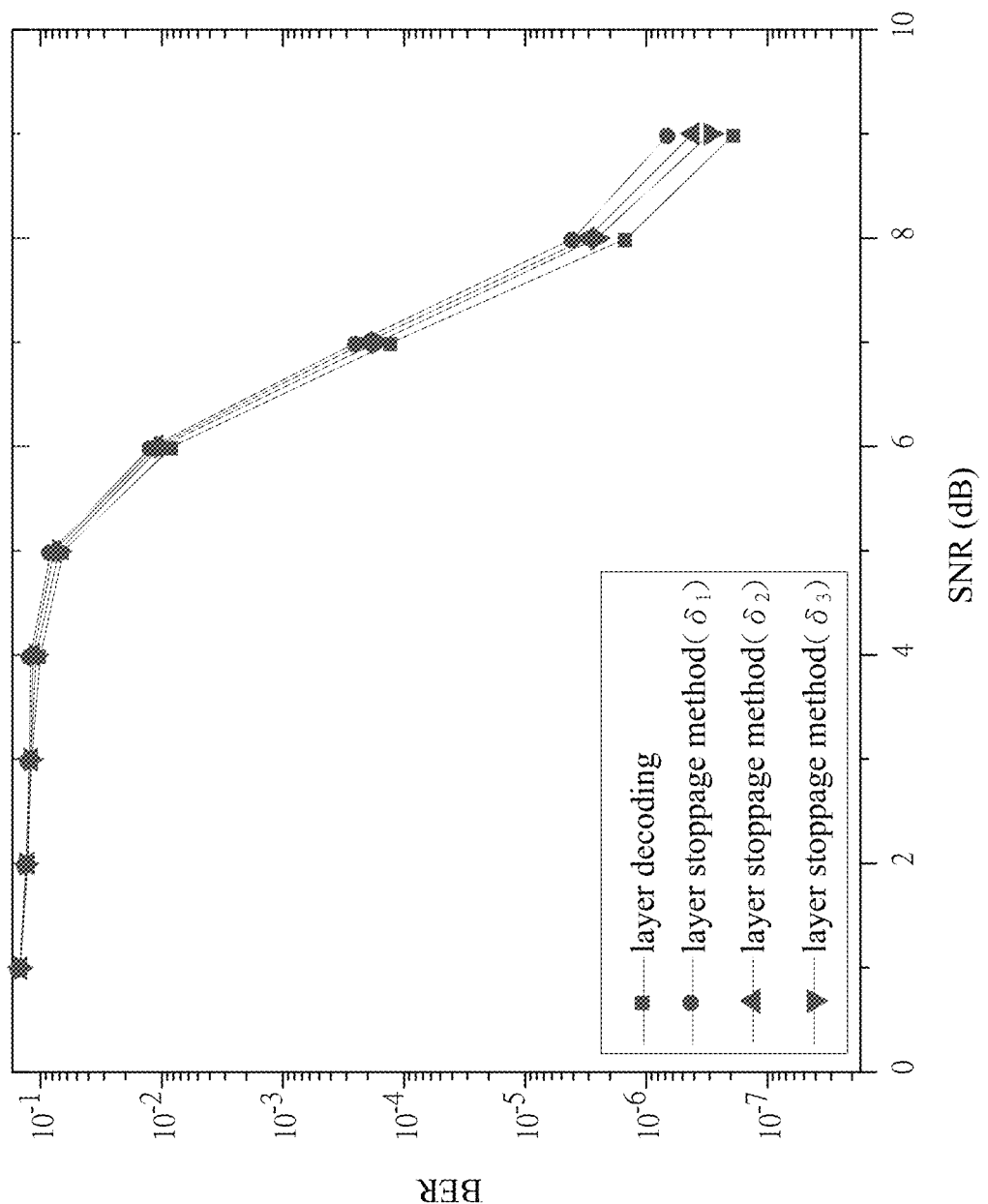
FIG. 8 is a schematic diagram showing a variance in layer decoding performance of the layer stoppage determination at different thresholds according to one embodiment of the present disclosure.

When the second embodiment is used in an environment with much noise and the parallel multi-core decoding processing is also adopted, MSA may be used in LDPC decoding. FIG. 4 summarizes the operations for the convergent layer and the non-convergent layer in the single core decoding context. As the layer stoppage determination could be applicable to multiple layers at the same time, multiple layer arithmetic units corresponding to the convergent layers may be skipped. Applied in the wireless channels in the densely populated area, the decoding performance of the presently disclosed method at different threshold is shown in FIG. 8.

Figure 9:
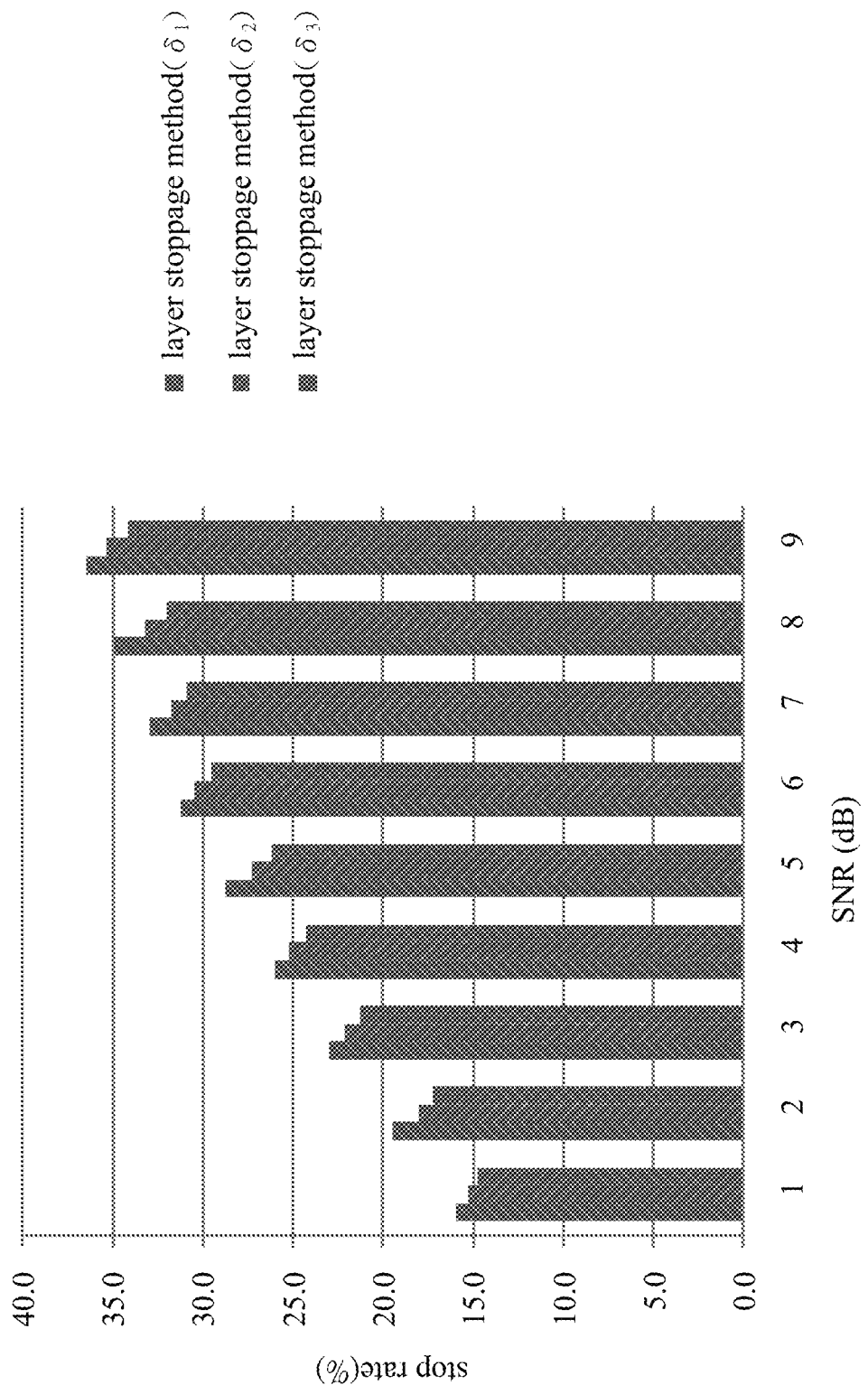
FIG. 9 is a schematic diagram showing a variance in stop rate of the layer stoppage determination method at different thresholds according to one embodiment of the present disclosure.

FIG. 9 meanwhile shows the variance in the stop rate at different thresholds when the present disclosure applies to the wireless channels in the densely populated area. With FIG. 9 and FIG. 8, the relationship between BER and the stop rate at different thresholds may be determined. It is worth noting that the lowered threshold setting may increase the number of the layer arithmetic units to be skipped in the subsequent iteration operation as more layer arithmetic units may be considered convergent. That the threshold is configurable helps satisfy the demands of large stop rate-low accuracy or low stop rate-high accuracy.

From the above embodiments, the present disclosure of skipping the convergent layer and diverting the output from one non-convergent layer to the next non-convergent layer bypassing the convergent layer may be effectively applied in the parallel multi-core decoding processing, without undermining the decoding performance while maintaining the quality stop rate. The layer stoppage defined on basis of the predetermined adjustable thresholds may be used in different communication channels and parallel multi-core decoding processing. And the overall power consumption of the LDPC decoder may be reduced.

Despite the previous two embodiments are based on the soft information, the scope of the present disclosure is not therefore limited. Rather, hard information of the layer decoding operation may be determined and compared with its respective predetermined adjustable threshold. As such, the convergence of the layer arithmetic unit may be determined. The hard information may be from a hard information value converted from the check node message, the variable node message, the a priori probability value, extrinsic probability value, the a posteriori probability value, and their combinations. The hard information value may be 0 or 1 (or negative or positive). The conversion may be based on the maximum bit value of the soft information in one embodiment, but not limited thereto. The comparison of the hard information may be based on different sets of the hard information converted from different soft information using hard values in consecutive iteration operations, the variance in the hard value, or parity equation ($H \cdot V^T = 0$) wherein H is LDPC code matrix and $V^T$ is a transposed vector for the code word as the hard information value.

The present disclosure may be with the following advantages:
(1) compared with the conventional arts the present disclosure could determine and arrive at the conclusion that certain layers have been convergent even before the convergence of all layers has been reached; therefore, the present disclosure may skip the convergent layer in the subsequent iteration operation so as to reduce the overall power consumption;
(2) according to the present disclosure the output from one non-convergent layer may be diverted to the next non-convergent layer bypassing the convergent layer without undermining the overall operation while maintaining the BER level; and (3) the present disclosure relies on the superior error correction capability associated with LDPC code decoding, realizing the potential of LDPC code to be more widely applied in international wireless communication standards.

Some modifications of these examples, as well as other possibilities will, on reading or having read this description, or having comprehended these examples, will occur to those skilled in the art. Such modifications and variations are comprehended within this disclosure as described here and claimed below. The description above illustrates only a relative few specific embodiments and examples of the present disclosure. The present disclosure, indeed, does include various modifications and variations made to the structures and operations described herein, which still fall within the scope of the present disclosure as defined in the following claims.

What is claimed is:

1. A method for stopping a layer operation in low density parity check (LDPC) decoding, comprising:
   determining an occurrence of a layer stoppage to detect and record a convergence of a layer arithmetic unit after performance of a layer decoding operation using LDPC decoding; and
   in a subsequent iteration operation stopping an operation of the layer arithmetic unit that has converged and repeating determining the layer stoppage for the layer arithmetic unit that has not yet converged.

2. The method according to claim 1, wherein the occurrence of the layer stoppage is based on the comparison using soft information or hard information of the layer decoding operation for determining the convergence of the layer arithmetic unit.

3. The method according to claim 2, wherein the soft information comprises a check node message, a variable node message, an a priori probability value, an extrinsic probability value, an a posteriori probability value, and their combinations.

4. The method according to claim 3, wherein the hard information comprises a hard information value converted from the check node message, the variable node message, the a priori probability value, the extrinsic probability value, the a posteriori probability value, and their combinations.

5. The method according to claim 2, wherein the layer arithmetic unit is characterized as a convergent layer so long as a layer associated with the convergent layer is entirely convergent and in the subsequent iteration operation no layer decoding operation using LDPC decoding is required for the convergent layer, and the layer arithmetic unit is characterized as a non-convergent layer when the layer associated with the non-convergent layer is not entirely convergent.

6. The method according to claim 5, wherein in the subsequent iteration operation an output of the non-convergent layer is diverted to the next non-convergent layer without being transmitted to the convergent layer in between.

7. The method according to claim 5, wherein in the subsequent iteration operation the soft information or the hard information in the determination of the occurrence of the layer stoppage is diverted to the next non-convergent layer from the previous convergent layer without being transmitted to the convergent layer in between.

8. The method according to claim 7, wherein the soft information comprises a check node message, a variable node message, an a priori probability value, an extrinsic probability value, an a posteriori probability value, and their combinations.

9. The method according to claim 7, wherein the hard information comprises a hard information value converted from the check node message, the variable node message, the a priori probability value, the extrinsic probability value, the a posteriori probability value, and their combinations.

10. The method according to claim 1, wherein the layer operations in multiple parallel layers are detected and stopped at the same time.

* * * * *